United States Patent
Sandhu et al.

(10) Patent No.: US 7,344,975 B2
(45) Date of Patent: Mar. 18, 2008

(54) METHOD TO REDUCE CHARGE BUILDUP DURING HIGH ASPECT RATIO CONTACT ETCH

(75) Inventors: Gurtej S. Sandhu, Boise, ID (US);
Max F. Hineman, Sunnyvale, CA (US);
Daniel A. Steckert, Boise, ID (US);
Jingyi Bai, San Jose, CA (US); Shane J. Trapp, Boise, ID (US); Tony Schrock, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 227 days.

(21) Appl. No.: 11/213,283

(22) Filed: Aug. 26, 2005

(65) Prior Publication Data
US 2007/0049018 A1 Mar. 1, 2007

(51) Int. Cl.
*H01L 21/4763* (2006.01)
(52) U.S. Cl. ............... 438/637; 438/709; 438/906; 257/E21.585
(58) Field of Classification Search ........... 438/618, 438/622, 634, 638, 639, 704, 706, 709, 723, 438/736, 743, 756, 637, 725, 906; 257/E21.585
See application file for complete search history.

(56) References Cited

U.S. PATENT DOCUMENTS

| | | | |
|---|---|---|---|
| 5,981,398 A * | 11/1999 | Tsai et al. | 438/710 |
| 6,228,774 B1 | 5/2001 | Marquez | |
| 6,440,640 B1 * | 8/2002 | Yang et al. | 430/314 |
| 6,573,030 B1 * | 6/2003 | Fairbairn et al. | 430/323 |
| 2003/0003755 A1 * | 1/2003 | Donohoe | 438/706 |

OTHER PUBLICATIONS

Soda et al.; On-Wafer Monitoring of Electrical Conductivity of Sidewall-deposited Polymer in SiO2 Etching Processes; 2 pgs.
Watanabe et al; Reduction of Microtrenching and Island Formation in Oxide Plasma Etching by Employing Electron Beam Charge Neutralization; Applied Physics Letters; Oct. 22, 2001; pp. 2698-2700; vol. 79, No. 17; American Institute of Physics; USA.

* cited by examiner

*Primary Examiner*—Brook Kebede
(74) *Attorney, Agent, or Firm*—Dinsmore & Shohl LLP

(57) ABSTRACT

A method of high aspect ratio contact etching a substantially vertical contact hole in an oxide layer using a hard photoresist mask is described. The oxide layer is deposited on an underlying substrate. A plasma etching gas is formed from a carbon source gas. Dopants are mixed into the gas. The doped plasma etching gas etches a substantially vertical contact hole through the oxide layer by doping carbon chain polymers formed along the sidewalls of the contact holes during the etching process into a conductive state. The conductive state of the carbon chain polymers reduces the charge buildup along sidewalls to prevent twisting of the contact holes by bleeding off the charge and ensuring proper alignment with active area landing regions. The etching stops at the underlying substrate.

41 Claims, 3 Drawing Sheets

METHOD TO REDUCE CHARGE BUILDUP DURING HIGH ASPECT RATIO CONTACT ETCH

BACKGROUND OF THE INVENTION

The present invention generally relates to High Aspect Ratio Contact trench etching and, in particular, relates to the reduction of charge buildup along the trench sidewalls during High Aspect Ratio Contact trench etching.

Successful construction of nano- and microstructures requires reliable and reproducible methods of production. One such nano- or microstructure is a contact hole, or trench. Contact hole structures are generally fabricated using wet (crystal anisotrophy) or dry plasma (ion-bombardment anisotrophy) etching. One example of a contact hole formed by dry plasma etching is shaped by etching through an oxide layer overlaying a silicon substrate using a hard photoresist mask deposited on top of the oxide layer, wherein the etching substantially stops on the underlying substrate layer. Contact holes have a diameter, also known as width, and a depth. The diameter is referred to as the feature size and tends to decrease with increasing circuit density. The aspect ratio is the ratio of depth to width and tends to increase as the width decreases. Modem integrated circuits are scaled with increasingly narrower design rules. In addition, as the width of the etched features decreases, the aspect ratio increases, necessitating a high aspect ratio contact trench etch process.

Therefore, high aspect ratio contact (HARC) trench etching is one of the key processes for forming contact hole interconnections. In typical plasma etching, positive ions are accelerated to the substrate by a radio frequency (RF) biased electrode sheath providing directionality for forming vertical contact hole profiles. The substrate layer is disposed on a chuck and placed within the gas chamber. The chuck acts as a bottom electrode and can be biased by a second RF power source. During plasma etching, plasma electrons, due to their random thermal motion, tend to impinge on the sidewalls near the top of the contact hole causing charge accumulation. Charge accumulation is one of the main causes of charge build-up damage, etching stop, as well as micro-loading effects.

Carbon chain polymers are a result of the plasma etching. Conductivity of the sidewalls in the contact holes increases during the etching processes resulting in carbon chain polymer buildup along the sidewalls of the contact hole. These deposited carbon chain polymers strongly affect the sidewall conductivity in the contact holes. The source of the carbon that form the carbon chain polymers may be from the hard photoresist mask, from the carbon source plasma etching gases, or from the oxide layer itself. Over the course of the etch process, the bottom of the contact hole charges positively while the sidewalls charge negatively, thereby creating undesired local electric fields within the contact hole.

During typical HARC etches, this charge buildup along the sidewalls of a narrow and deep opening can deflect the incoming ions causing changes in the trajectory of those ions. This, in turn, results in the contact hole twisting during its formation and becoming non-vertical. Further, sidewall charging may also lead to complete etch stoppage in HARC contact holes. Another related issue associated with the charge buildup along the sidewalls is that the contact hole misses the active area landing region in the underlying substrate due to the twisting of the contact hole during its formation. Therefore, it is important to produce vertically straight contact holes because straight sidewall profiles ensure that the subsequently deposited metal material can properly fill the etched feature and make suitable electrical contact with the active area landing region.

Therefore, there is a need for a method to reduce charge buildup along the carbon chain polymer which forms along the sidewalls of the contact holes during HARC etching in order to produce substantially vertical contact holes.

There is also a need for a method to produce substantially vertical contact holes without shutting off the etch component of the HARC etching.

In addition, there is a need for a method which increases the step coverage of the carbon chain polymer buildup along the sidewall in order to enable the charge buildup to bleed off.

BRIEF SUMMARY OF THE INVENTION

According to one embodiment of the present invention, a method of high aspect ratio contact etching is used to etch a substantially vertical contact hole in an oxide layer using a hard photoresist mask. The oxide layer is deposited on top of an underlying silicon layer. The hard photoresist layer is then deposited on the oxide layer. A plasma etching gas is formed from a carbon source gas. Dopants, in the form of atoms, molecules and/or ions, are mixed into the carbon source gas. The doped plasma etching gas etches a substantially vertical contact hole through the hard photoresist mask and oxide layers. The doped plasma etching gas dopes the carbon chain polymer formed and deposited along the sidewalls of the contact holes during the etching process into a conductive state. The conductive state of the carbon chain polymers reduces the charge buildup along sidewalls of the contact holes and ensuring proper alignment with active area landing regions to prevent twisting of the contact holes by bleeding off the charge. The etching is stopped at the underlying silicon layer.

Accordingly, it is a feature of embodiments of the present invention to introduce dopants into the plasma etching gas in order to prevent charge buildup along the sidewalls of vertical contact holes to avoid the twisting of the vertical contact holes during formation and to ensure proper alignment with active area landing regions.

Other features of embodiments of the present invention will be apparent in light of the following detailed description of the invention and accompanying drawings.

BRIEF DESCRIPTION OF THE SEVERAL VIEWS OF THE DRAWINGS

The following detailed description of specific embodiments of the present invention can be best understood when read in conjunction with the following drawings, where like structure is indicated with like reference numerals and in which.

DETAILED DESCRIPTION

In the following detailed description of the preferred embodiments, reference is made to the accompanying drawings that form a part hereof, and in which are shown by way of illustration, and not by way of limitation, specific preferred embodiments in which the invention may be practiced. It is to be understood that other embodiments may be utilized and that logical, mechanical and electrical changes may be made without departing from the spirit and scope of the present invention.

Figure 1:
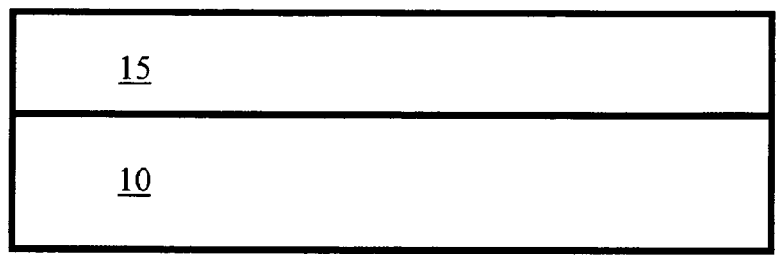
FIG. 1 illustrates a partially completed semiconductor device having portions of the silicon substrate covered with an oxide layer according to an embodiment of the present invention.

FIG. 1 illustrates a partially completed semiconductor device. The devices comprises a substrate layer 10. An oxide layer 15 is deposited on top of the substrate layer 10. The substrate layer 10 is typically comprised of silicon, silicon oxide or any other suitable material known in the art. The oxide layer 15 can be comprised of borophosphosilicate (BPSG), tetraethylorthosilicate (TEOS), phosphorous-doped silicate glass (PSG) or any other suitable oxide material.

Figure 2:
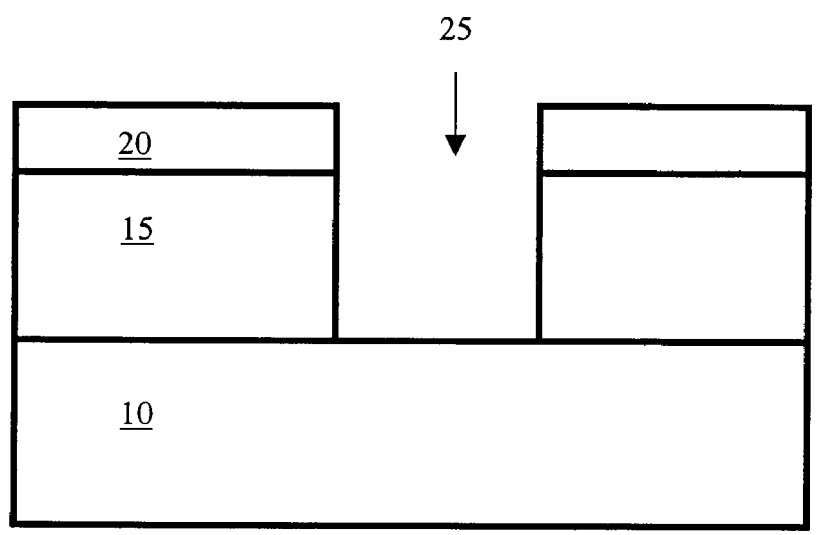
FIG. 2 illustrates the partially completed semiconductor device of FIG. 1 with an additional hard photoresist mask layer, as well as illustrating an etched contact hole according to an embodiment of the present invention.

FIG. 2 illustrates the partially completed semiconductor device of FIG. 1 with an additional hard photoresist mask layer 20 deposited on the oxide layer 15. The hard photoresist mask 20 comprises transparent amorphous carbon or any other suitable material known in the art. The preferred amorphous carbon layer is transparent in the visible light range and is formed with a thickness that does not substantially affect the reading of the alignment marks on the device to allow for the proper alignment and etching of the contact holes. The visible light range includes any light having a wavelength between about 400 nm and about 700 nm. The amorphous carbon layer has a substantially low absorption coefficient of between about 0.15 and about 0.001 at a wavelength of 633 nm.

The device comprising the substrate layer 10 and oxide layer 15 is placed in a plasma enhanced chemical vapor deposition (PECVD) chamber. The amorphous carbon hard photoresist mask layer 20 is then deposited over the oxide layer 15 in the PECVD chamber. The temperature of the chamber is set to range from about 200° C. to about 500° C. A process gas including propylene ($C_3H_6$) is introduced into the chamber at a flow rate of about 500 standard cubic centimeters per minute (sccm) to about 3000 sccm. An additional gas including helium may be introduced into the chamber at a rate of about 250 sccm to about 1000 sccm. At least one other hydrocarbon gas can be used in the process gas such as, for example $CH_4$, $C_2H_2$, $C_2H_4$, $C_2H_6$, and $C_3H_8$. Helium can also be used in combination with at least one these hydrocarbon gases. During the process, the chamber is subjected to a RF power and a pressure. The radio frequency is set between about 450 Watts and about 1000 Watts. The pressure can range from about 4 Torr to about 6.5 Torr. After removal from the PECVD chamber, the hard photoresist mask layer 20 is then patterned to define the active area landing regions for the contact holes 25 to be etched into the oxide layer 15.

The partially completed semiconductor device is illustrated in FIG. 2 as having a contact hole 25. The contact hole 25 is etched using a HARC plasma gas etch through the oxide layer 15 following the pattern defined on the hard photoresist mask 20 within a plasma gas processing chamber. The HARC etchants react with the material of the oxide layer 15 to etch the contact hole 25 into the oxide layer 15. The HARC etching substantially stops upon reaching the underlying substrate layer 10.

Figure 3:
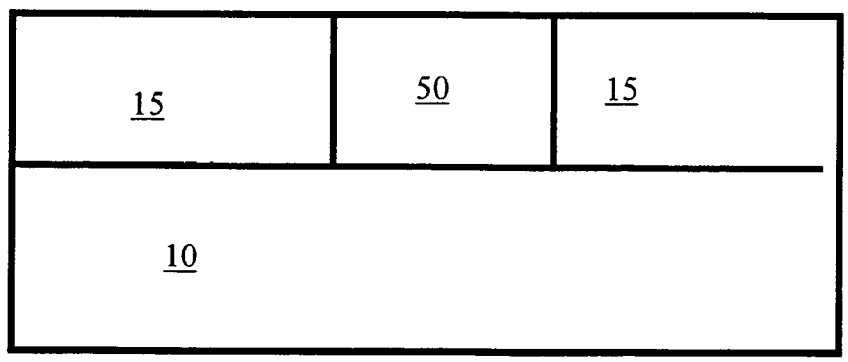
FIG. 3 illustrates the completed semiconductor device according to an embodiment of the present invention.
Figure 4:
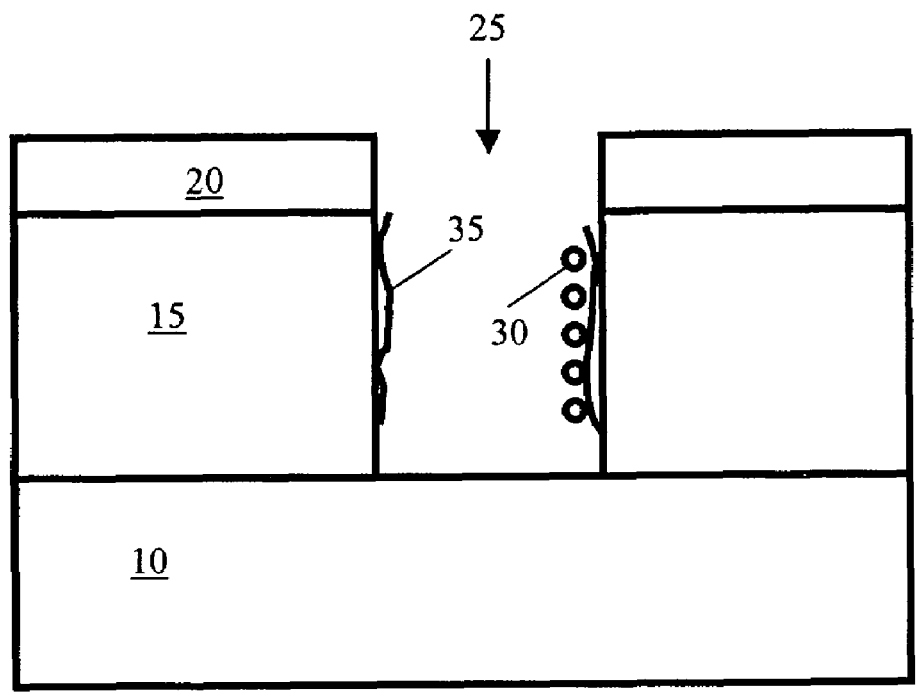
FIG. 4 schematically illustrates the polymer carbon chain buildup along the sidewalls of an etched contact hole.
Figure 5:
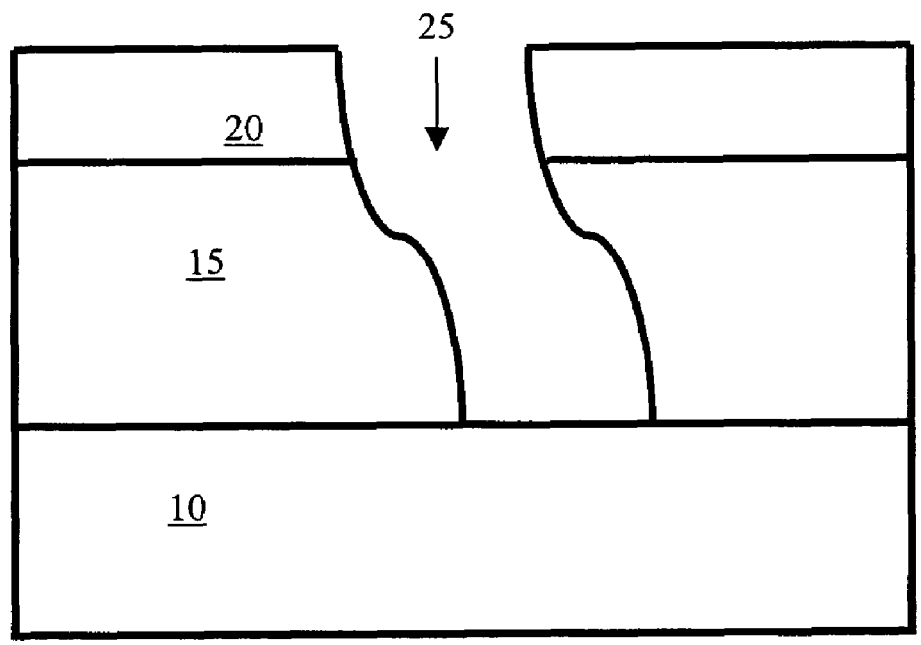
FIG. 5 illustrates the twisting of the contact hole resulting from the charge buildup along the polymer carbon chain that had been deposited along the sidewalls of an etched contact hole.

FIG. 4 illustrates a polymer carbon chain 35 that can build up and be deposited along the sidewalls of an etched contact hole 25 during HARC trench etching. The conductivity of sidewalls in the contact hole 25 is increased during the etching processes resulting in a charge buildup 30 on the polymer carbon chains 35 along the sidewalls of the contact hole 25. The source of the carbon atoms of the carbon chain polymer 35 may result from carbon in the hard photoresist mask 20, from carbon in the source plasma etching gases, or from carbon impurities in the oxide layer 15 itself. During a typical HARC trench etch, the charge buildup 30 along the sidewalls of the narrow and deep opening of the contact hole 25 can deflect the incoming etching ions causing changes in the trajectory of the ions. Such a changed trajectory results in the contact hole 25 twisting, or bending, away from a straight vertical position. An example of the twisting of the contact hole 25 is illustrated in FIG. 5. The hard photoresist mask 20 and carbon chain polymers 35 are then removed by dry stripping and wet cleaning. The contact hole 25 is then subsequently filled with a conductive metal material 50 to form a conductive path to the active area landing region on a underlying substrate 10 as illustrated in FIG. 3.

Figure 6:
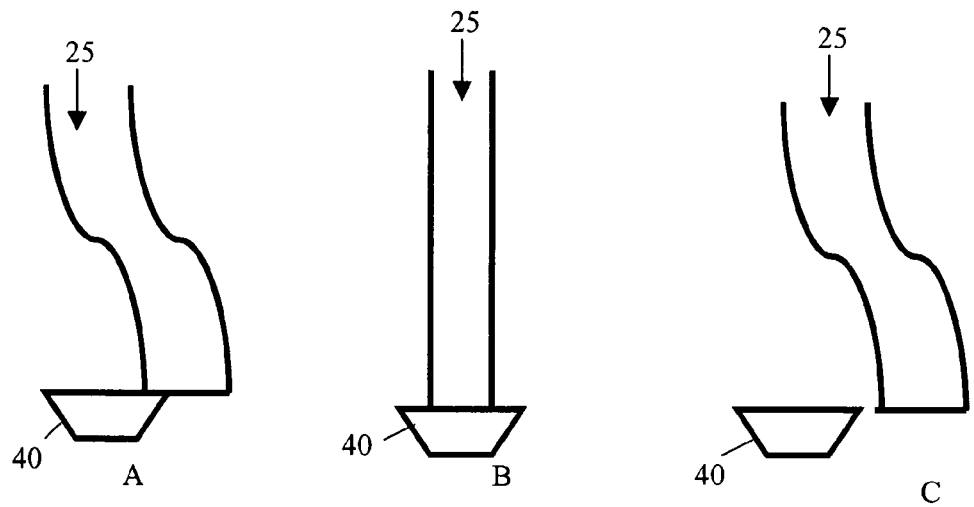
FIG. 6 illustrates the possible contact hole misalignments with the active area landing regions as a result of the twisting of the contact holes.

A non-vertical contact hole 25 can create many problems. FIG. 6 illustrates one such problem associated with contact hole 25 twisting. FIG. 6B illustrates the preferred alignment of the contact hole 25 with the active area landing region 40 in which there is no twisting of the contact hole 25 ensuring that the subsequently deposited conductive metal makes suitable contact with the active area landing region 40. FIG. 6A illustrates a twisted contact hole 25 that makes only partial contact with the active area landing region 40 resulting in an imperfect contact between the subsequently deposited conductive metal and the active area landing region 40. Finally, FIG. 6C illustrates a contact hole 25 that is so twisted that it completely misses the active area landing region 40. In FIG. 6C, no contact is made between the contact hole 25 and the active area landing region 40 resulting in the failure of the subsequently deposited conductive metal to make a suitable contact with the active area landing region 40.

Figure 7:
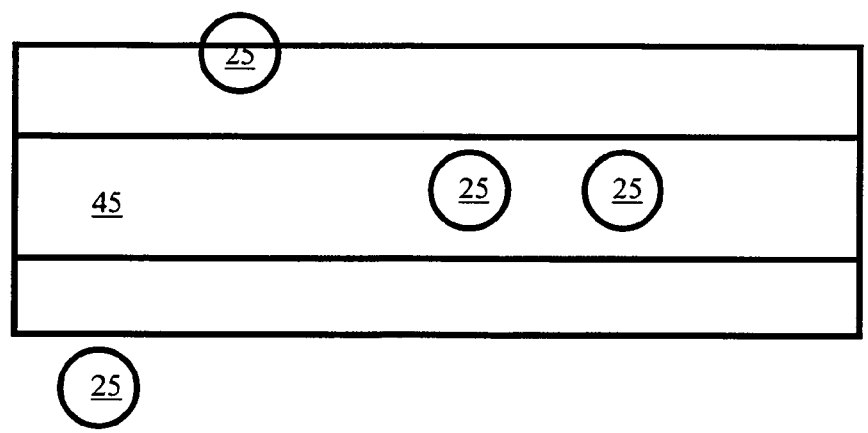
FIG. 7 illustrates an overhead view of the possible contact hole misalignments with the active area resulting from the twisting on the contact holes.

FIG. 7 provides another view of the problems associated with contact hole twisting. FIG. 7 illustrates an overhead view of the active area 45 and the importance of etching substantially vertical contact holes 25. When there is proper alignment and no twisting of the contact hole 25, the contact holes 25 are positioned within the active area 45. However, when twisting occurs, the contact holes 25 twist away from the active area 45 and subsequently fall outside the active area 45. These contact holes 25 do not make contact with the active area 45 when the contact holes 25 are subsequently filled with conductive metal.

The problems of contact hole twisting due to charge build up along the sidewalls associated with HARC plasma etching can be minimized by the addition of dopants in the form of atoms, molecules, and/or ions to the HARC plasma etching gas. The carbon chain polymers are doped with appropriate dopants such as iodine during the plasma gas etching of the contact holes. At least a portion of the dopants in the plasma etch stream lodge on the sidewalls and the carbon chain polymers that build up on the sidewalls. Doping the carbon chain polymers increases their conductivity and aids in bleeding off the charge build up along the carbon chain polymers. When the carbon chain polymer is conductive, it allows for dissipation of the charge into the plasma. By bleeding off the charge build up along the sidewalls, the incoming etching ions from the doped plasma etching gas will not be deflected, and the sidewalls of the contact hole will be substantially vertical.

The HARC plasma etching source gas is typically a hydrocarbon fluoride such as, for example, $CH_2F_2$, $C_4F_8$; $CHF_3$; $C_2F_6$, $C_2HF_5$; $CH_3F$; or $C_3H_3F_5$, $C_4F_8$ that has been mixed with oxygen gas. The dopants can be introduced into the HARC plasma etching gas as part of a molecule such as, for example, HI and $CH_3I$ in the case where iodine is the dopants. The dopants are introduced into the dry etch chamber during the HARC plasma gas etching. Other dopants, such as, for example carbon (C), potassium (K), calcium (Ca), phosphorus fluoride ($PF_6$), boron fluoride ($BF_3$), chloride (Cl) and arsenic fluoride ($AsF_6$) can also be used. The step coverage of the carbon chain polymer along the sidewalls is increased to better enable the charge bleed off. The doping level is carefully controlled in order to ensure that the etch component of the HARC plasma etching gas is not shut off. The dopants may be introduced intermittently, or pulsed, during the etch process.

It is noted that terms like "preferably," "commonly," and "typically" are not utilized herein to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

For the purposes of describing and defining the present invention it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A method of high aspect ratio contact etching a substantially vertical contact hole, the method comprising:
   forming a plasma etching gas from a carbon source gas;
   mixing a dopant into said plasma etching gas;
   overlaying an oxide layer with a hard photoresist mask, wherein said oxide layer overlays a substrate;
   etching said substantially vertical contact hole through said hard photoresist mask and said oxide layer with said etching plasma, wherein the dopant plasma etching gas reduces carbon chain polymer charge that builds up along sidewalls of said substantially vertical contact hole during said etching;
   stopping said etching at said underlying substrate; and
   removing said hard photoresist mask and carbon chain polymers.

2. The method of claim 1 wherein said plasma etching gas comprises a hydrocarbon fluoride mixed with oxygen gas.

3. The method of claim 2 wherein said hydrocarbon fluoride comprises one of $CH_2F_2$, $C_4F_8$; $C_3H_3F_5$, $C_4F_8$; $CHF_3$; $C_2F_6$; $C_2HF_5$, $CH_3F$ or combinations thereof.

4. The method of claim 1 wherein mixing further comprises:
   doping said plasma etching gas with dopant atoms.

5. The method of claim 4 wherein said dopant atoms contain iodine.

6. The method of claim 4 said dopant atoms are introduced as part of a molecule into a dry etch chamber during said high aspect ratio contact hole etching.

7. The method of claim 6 wherein said dopant molecule comprises one of HI, $CH_3I$ or combinations thereof.

8. The method of claim 1 wherein said dopant comprises one of carbon, potassium, calcium, $PF_6$, $BF_3$, chloride, $AsF_6$ or combinations thereof.

9. The method of claim 1 wherein said oxide layer comprises a glass.

10. The method of claim 9 wherein said glass comprises one of borophosphosilicate, tetraethylorthosilicate, phosphorous-doped silicate glass or combinations thereof.

11. The method of claim 9 wherein said glass comprises of borophosphosilicate.

12. The method of claim 1 wherein said hard photoresist mask comprises a transparent amorphous carbon.

13. The method of claim 12 wherein said hard photoresist mask is deposited on said oxide layer in a plasma enhanced vapor deposition chamber.

14. The method of claim 12 wherein said hard photoresist mask has a thickness that allows for the reading of alignment marks on said oxide layer.

15. The method of claim 1 wherein said hard photoresist mask is patterned for said high aspect ratio contact hole etching.

16. The method of claim 1 wherein said substrate is comprised of silicon, silicon oxide or combinations thereof.

17. The method of claim 1 further comprising:
   doping said carbon chain polymer into a conductive state with the dopant plasma etching gas.

18. The method of claim 1 wherein reducing said carbon chain polymer charge buildup results in said charge being bled off.

19. The method of claim 1 wherein reducing said carbon chain polymer charge buildup substantially prevents ion deflection of said dopant plasma etching gas within said substantially vertical contact holes.

20. The method of claim 1 wherein reducing said carbon chain polymer charge buildup reduces misalignment of said substantially vertical contact holes within an active area.

21. The method of claim 1 further comprising:
   filling said substantially vertical contact hole with a metallic material to form a conductive path to said substrate.

22. The method of claim 1 further comprising:
   increasing step coverage of said carbon chain polymers to better enable charge bleed off.

23. The method of claim 1 further comprising:
   controlling dopant level in said plasma etching gas to ensure etching is not shut off.

24. The method of claim 1 wherein reducing said carbon chain polymer charge buildup reduces misalignment of said substantially vertical contact holes within an active area landing region.

25. A method of high aspect ratio contact etching a substantially vertical contact hole, the method comprising:
   forming an oxide layer over a substrate;
   depositing a hard photoresist mask over said oxide layer;
   forming a plasma etching gas from a carbon source gas;
   mixing a dopant into said plasma etching gas;
   etching said substantially vertical contact hole through said oxide layer with the dopant etching plasma gas, wherein said dopant plasma etching gas reduces carbon chain polymer charge that is built up along sidewalls of said substantially vertical contact hole during etching by doping said carbon chain polymers into a conductive state and wherein said dopant etching plasma gas reduces deflection of said dopant plasma etching gas from a straight path within said substantially vertical contact hole;
   stopping said etching at said substrate; and
   removing said hard photoresist mask and carbon chain polymers.

26. The method of claim 25 wherein said oxide layer is comprised of glass.

27. The method of claim 25 wherein said hard photoresist mask comprises a transparent amorphous carbon.

28. The method of claim 25 wherein said dopant comprises iodine.

29. The method of claim 25 wherein said dopant comprises one of carbon, potassium, calcium, $PF_6$, $BF_3$, chloride, $AsF_6$ or combinations thereof.

30. A method of high aspect ratio contact etching a substantially vertical contact hole, the method comprising:
   forming an oxide layer over a substrate;
   depositing a hard photoresist mask over said oxide layer;
   patterning said hard photoresist mask;
   forming a plasma etching gas from a carbon source gas;
   mixing a dopant into said plasma etching gas;
   etching said substantially vertical contact hole through said oxide layer using said pattern in said hard photoresist mask with the dopant plasma etching gas, wherein said dopant plasma etching gas reduces carbon chain polymer charge built up along sidewalls of said substantially vertical contact hole during said etching by doping said carbon chain polymers into a conductive state and wherein said dopants reduce deflection of said plasma etching gas within said substantially vertical contact holes;
   increasing step coverage of said carbon chain polymer to bleed off charge build up;
   controlling said dopant level in said plasma etching gas to ensure etching of said oxide layer is not shut off;
   stopping said etching at said substrate; and
   removing said hard photoresist mask and carbon chain polymers.

31. The method of claim 30 wherein said hard photoresist mask comprises a transparent amorphous carbon.

32. The method of claim 30 wherein said dopant contains iodine.

33. The method of claim 30 wherein said dopants contains one of carbon, potassium, calcium, $PF_6$, $BF_3$, chloride, $AsF_6$ or combinations thereof.

34. A method of high aspect ratio contact etching a substantially vertical contact hole, the method comprising:
   forming an oxide layer over a substrate;
   depositing a transparent amorphous carbon hard photoresist mask over said oxide layer;
   patterning said transparent amorphous carbon hard photoresist mask;
   forming a plasma etching gas from a carbon source gas;
   mixing a dopant into said plasma etching gas;
   etching said substantially vertical contact hole through said oxide layer using said pattern in said transparent amorphous carbon hard photoresist mask with said dopant plasma etching gas, wherein said dopant plasma etching gas reduces carbon chain polymer charge built up along sidewalls of said substantially vertical contact hole during said etching by doping said carbon chain polymers into a conductive state and wherein said dopant plasma etching gas reduces deflection of said dopant plasma etching gas within said substantially vertical contact holes;
   increasing step coverage of said carbon chain polymer to bleed off charge buildup on said carbon chain polymer;
   controlling said dopant level in said plasma etching gas to ensure etching of said oxide layer is not shut off;
   stopping said etching at said silicon substrate;
   removing said transparent amorphous carbon hard photoresist mask and said carbon chain polymer buildup by dry stripping and wet cleaning; and
   filling said substantially vertical contact hole with conductive metal to form a path to said silicon substrate.

35. The method of claim 34 wherein said dopant contain iodine.

36. The method of claim 34 wherein said dopant contains one of carbon, potassium, calcium, $PF_6$, $BF_3$, chloride, $AsF_6$ or combinations thereof.

37. A method of high aspect ratio contact etching a substantially vertical contact hole, the method comprising:
   forming an oxide layer over a silicon substrate;
   depositing a transparent hard photoresist mask over said oxide layer;
   patterning said transparent hard photoresist mask;
   forming a plasma etching gas from a carbon source gas;
   mixing a dopant into said plasma etching gas;
   etching said substantially vertical contact hole through said oxide layer using said pattern in said transparent hard photoresist mask with said dopant plasma etching gas, wherein said dopant plasma etching gas reduces carbon chain polymer charge buildup along sidewalls of said substantially vertical contact hole during said etching by doping said carbon chain polymers into a conductive state, wherein said dopant plasma etching gas reduces ion deflection of said dopant plasma etching gas within said substantially vertical contact holes to align said substantially vertical contact holes within an active area;
   increasing step coverage of said carbon chain polymer to bleed off charge build up;
   controlling said dopant level in said plasma etching gas to ensure etching of said oxide layer is not shut off;
   stopping said etching at said silicon substrate;
   removing said transparent hard photoresist mask and said carbon chain polymer buildup by dry stripping and wet cleaning; and
   filling said substantially vertical contact hole with conductive metal to form a path to said silicon substrate.

38. The method of claim 37 wherein said transparent hard photoresist mask comprises amorphous carbon.

39. The method of claim 37 wherein said dopant contains iodine.

40. The method of claim 37 wherein said dopant contains one of carbon, potassium, calcium, $PF_6$, $BF_3$, chloride, $AsF_6$ or combinations thereof.

41. A method of high aspect ratio contact etching a substantially vertical contact hole, the method comprising:
   forming an oxide layer over a silicon substrate;

depositing a transparent amorphous carbon hard photoresist mask over said oxide layer;

patterning said transparent amorphous carbon hard photoresist mask;

forming a plasma etching gas from a carbon source gas;

mixing a dopant containing iodine into said plasma etching gas;

etching said substantially vertical contact hole through said oxide layer using said pattern in said transparent amorphous carbon hard photoresist mask with said dopant plasma etching gas, wherein said dopant plasma etching gas reduces carbon chain polymer charge buildup along sidewalls of said substantially vertical contact hole during said etching by doping said carbon chain polymers into a conductive state, wherein said dopant plasma etching gas reduces ion deflection of said dopant plasma etching gas within said substantially vertical contact holes to align said substantially vertical contact holes within an active area;

increasing step coverage of said carbon chain polymer to bleed off charge build up;

controlling said dopant level in said plasma etching gas to ensure etching of said oxide layer is not shut off;

stopping said etching at said silicon substrate;

removing said transparent amorphous carbon hard photoresist mask and said carbon chain polymer buildup by dry stripping and wet cleaning; and filling said substantially vertical contact hole with conductive metal to form a path to said silicon substrate.

* * * * *